United States Patent
Yu et al.

(10) Patent No.: US 11,401,467 B2
(45) Date of Patent: Aug. 2, 2022

(54) DISPLAY DEVICE USING TWO-DIMENSIONAL PHASE TRANSITION MATERIAL AND METHOD FOR MANUFACTURING SAME

(71) Applicant: KOREA ADVANCED INSTITUTE OF SCIENCE AND TECHNOLOGY, Daejeon (KR)

(72) Inventors: Kyoungsik Yu, Daejeon (KR); Jung Hoon Park, Daejeon (KR); Yeonghoon Jin, Daejeon (KR); Youngjae Jeong, Daejeon (KR); Taewon Park, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 122 days.

(21) Appl. No.: 16/962,784

(22) PCT Filed: Dec. 11, 2019

(86) PCT No.: PCT/KR2019/017464
§ 371 (c)(1),
(2) Date: Jul. 16, 2020

(87) PCT Pub. No.: WO2020/122586
PCT Pub. Date: Jun. 18, 2020

(65) Prior Publication Data
US 2020/0354631 A1    Nov. 12, 2020

(30) Foreign Application Priority Data
Dec. 12, 2018    (KR) .......................... 10-2018-0159856

(51) Int. Cl.
*C09K 11/68*    (2006.01)
*G02F 1/00*    (2006.01)
(Continued)

(52) U.S. Cl.
CPC .......... *C09K 11/681* (2013.01); *G02F 1/0018* (2013.01); *G02F 1/0054* (2013.01);
(Continued)

(58) Field of Classification Search
CPC .... G02F 1/1335; G02F 1/133345; G02F 1/29; G02F 1/1393; G02F 1/134363;
(Continued)

(56) References Cited

U.S. PATENT DOCUMENTS 9,368,720 B1 *    6/2016    Moon ..................... H01L 45/16
9,484,489 B2 *    11/2016    Li .......................... B01J 19/127
(Continued)

FOREIGN PATENT DOCUMENTS

GB    2546265 A    *    7/2017    ............. G02F 1/015
KR    10-2011-0106267        9/2011
(Continued)

OTHER PUBLICATIONS

International Search Report dated Apr. 21, 2020 for PCT/KR2019/017464.

*Primary Examiner* — Christopher Stanford
*Assistant Examiner* — Journey F Sumlar (57) ABSTRACT

The present invention relates to a display device using a two-dimensional phase transition material including: a substrate; a metal layer formed on the substrate; an insulation layer formed on the metal layer; a transparent electrode layer formed on the insulation layer; a light absorption layer formed on the transparent electrode layer and formed of a phase transition material; and a passivation layer formed on the light absorption layer, wherein the light absorption layer undergoes reversible phase transition depending on any of temperature, magnetic field and electric field.

13 Claims, 8 Drawing Sheets

(51) Int. Cl.
    *G02F 1/09* (2006.01)
    *C01B 19/00* (2006.01)
(52) U.S. Cl.
    CPC .............. *G02F 1/09* (2013.01); *C01B 19/007* (2013.01); *G02F 2203/50* (2013.01)
(58) Field of Classification Search
    CPC ...... G02F 1/133553; G02F 1/136; G02F 1/13; G02F 1/133707; G02F 1/1343; G02F 1/167; G02F 1/133504; G02F 1/155; G02F 2203/50; G02F 1/09; G02F 1/0054; G02F 1/0036; G02F 1/0027; G02F 1/0018
    See application file for complete search history.

(56) References Cited

U.S. PATENT DOCUMENTS

| | | | |
|---|---|---|---|
| 10,090,466 B2* | 10/2018 | Chan | ................... G01J 3/0224 |
| 10,403,708 B2* | 9/2019 | Ergen | ................... B01J 23/002 |
| 2015/0316820 A1* | 11/2015 | Duston | ............... G02F 1/13439 |
| | | | 349/138 |
| 2016/0181516 A1 | 6/2016 | Reed et al. | |

FOREIGN PATENT DOCUMENTS

| | | |
|---|---|---|
| KR | 10-2015-0040065 | 4/2015 |
| KR | 10-2016-0107556 | 9/2016 |
| KR | 10-2017-0098053 | 8/2017 |
| KR | 10-2018-0015956 | 2/2018 |

* cited by examiner

FIG. 1

< Prior Art >

Room temperature      High temperature

DISPLAY DEVICE USING TWO-DIMENSIONAL PHASE TRANSITION MATERIAL AND METHOD FOR MANUFACTURING SAME

This application claims the priority of Korean Patent Application No. 10-2018-0159856, filed on Dec. 12, 2018 in the KIPO (Korean Intellectual Property Office), the disclosure of which is incorporated herein entirely by reference. Further, this application is the National Stage application of International Application No. PCT/KR2019/017464, filed Dec. 11, 2019, which designates the United States and was published in Korean. Each of these applications is hereby incorporated by reference in their entirety into the present application.

TECHNICAL FIELD

The present disclosure relates to a display device using a two-dimensional phase transition material and a method for manufacturing the same.

BACKGROUND ART

Molybdenum ditelluride ($MoTe_2$) is a transition metal dichalcogenide (TMDC) material with a small band gap of approximately 0.93-1.1 eV, allowing effective detection of light in the near infrared (NIR) region.

Figure 1:
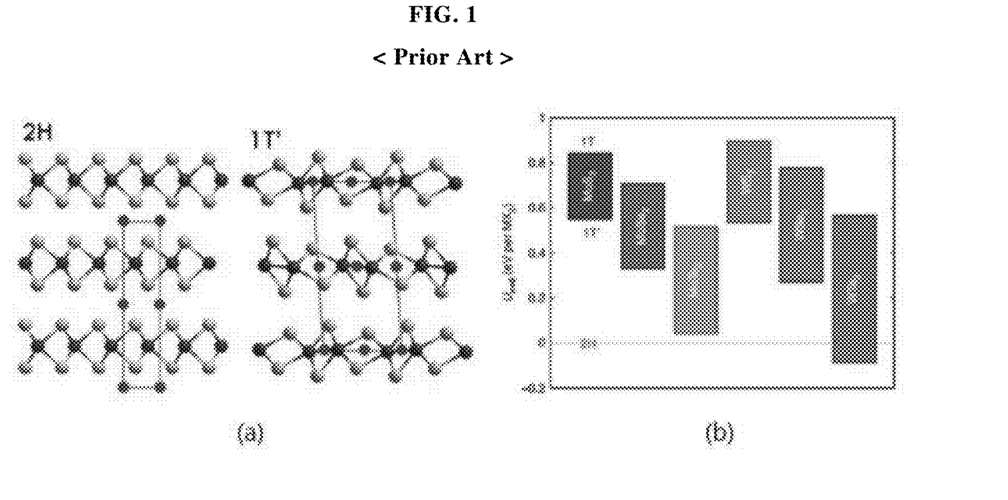
FIG. 1 illustrates the phase transition of molybdenum ditelluride.

FIG. 1 illustrates the phase transition of molybdenum ditelluride. (a) illustrates phase transition, and (b) illustrates phase transition energy.

Referring to FIG. 1, molybdenum ditelluride has a sandwich structure composed of one molybdenum atom and two tellurium atoms. Typically, a 2H (hexagonal) phase and a 1T' (octahedral) phase exist stably. The 2H phase exhibits semiconducting properties and the 1T' phase exhibits semimetallic properties.

Molybdenum ditelluride, which usually exists in the 2H phase, is converted from the 2H phase to the 1T' phase depending on external conditions such as heat, charge transfer, pressure, etc.

In addition, molybdenum ditelluride is highly applicable as a phase transition material because the energy difference of the ground states of the two phases is very small as ~43 meV unlike other TMDC materials.

DISCLOSURE OF THE INVENTION

Technical Problem

A method for providing an electrically variable display device using molybdenum ditelluride, which is a two-dimensional phase transition material, is needed in the art.

Technical Solution

An exemplary embodiment of the present disclosure provides a display device using a two-dimensional phase transition material.

The display device using a two-dimensional phase transition material may include: a substrate; a metal layer formed on the substrate; an insulation layer formed on the metal layer; a transparent electrode layer formed on the insulation layer; a light absorption layer formed on the transparent electrode layer and consisting of a phase transition material; and a passivation layer formed on the light absorption layer, wherein the light absorption layer undergoes reversible phase transition depending on any of temperature, magnetic field and electric field.

Another exemplary embodiment of the present disclosure provides a method for manufacturing a display device using a two-dimensional phase transition material.

The method for manufacturing a display device using a two-dimensional phase transition material may include: a step of forming a metal layer on a substrate; a step of forming an insulation layer on the metal layer; a step of forming a transparent electrode layer on the insulation layer; a step of forming a light absorption layer consisting of a phase transition material on the transparent electrode layer; and a step of forming a passivation layer on the light absorption layer, wherein the light absorption layer undergoes reversible phase transition depending on any of temperature, magnetic field and electric field.

The foregoing description does not list all the features of the present disclosure. The various features of the present disclosure and advantages and effects arising therefrom will be understood in more detail through the following specific exemplary embodiments.

Advantageous Effects

According to an exemplary embodiment of the present disclosure, an electrically variable display device may be provided using molybdenum ditelluride, which is a two-dimensional phase transition material.

BEST MODE FOR CARRYING OUT THE INVENTION

Hereinafter, specific exemplary embodiments are described in detail so that those having ordinary skill in the art to which the present disclosure belongs can easily carry out the present disclosure referring to the attached drawings.

When describing the specific exemplary embodiment of the present disclosure, detailed description of known function or constitution will be omitted to avoid unnecessarily obscuring the subject matter of the present disclosure.

The exemplary embodiments are provided as examples for fully conveying the idea of the present disclosure to those skilled in the art. Accordingly, the present disclosure is not limited by the exemplary embodiments and may be embodied into other forms. In the drawings, the width, length, thickness, etc. of the components may be exaggerated for the sake of convenience. Throughout the specification, like numerals denote like elements.

The present disclosure provides an electrically variable display device using molybdenum ditelluride, which is a two-dimensional phase transition material, and a method for manufacturing the same. Molybdenum ditelluride undergoes reversible phase transition depending on external conditions, i.e., any of temperature, magnetic field and electric field, and an electrically variable display device can be embodied by utilizing this property.

Figure 2:
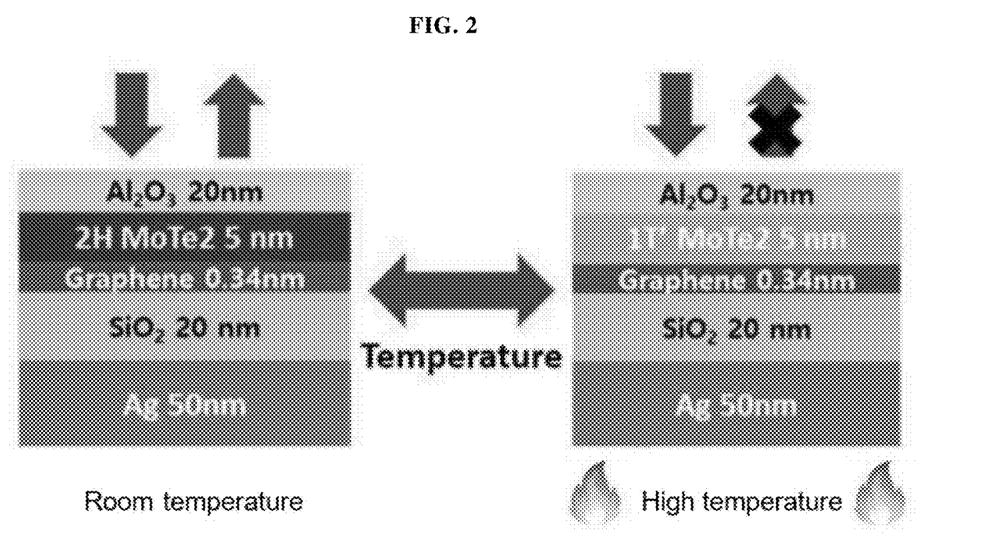
FIG. 2 schematically shows a display device using a two-dimensional phase transition material according to an exemplary embodiment of the present disclosure.

FIG. 2 schematically shows a display device using a two-dimensional phase transition material according to an exemplary embodiment of the present disclosure.

As shown in FIG. 2, a display device using a two-dimensional phase transition material according to an exemplary embodiment of the present disclosure may be configured by including a metal layer (Ag) formed on a substrate (not shown), an insulation layer ($SiO_2$) formed on the metal layer (Ag), a transparent electrode layer (graphene) formed on the insulation layer ($SiO_2$), a light absorption layer ($MoTe_2$) formed on the transparent electrode layer (graphene), and a passivation layer ($Al_2O_3$) formed on the light absorption layer ($MoTe_2$).

The light absorption layer may be formed of molybdenum ditelluride ($MoTe_2$), which is a two-dimensional phase transition material. The light absorption layer of the display device undergoes reversible phase change (i.e., 2H $MoTe_2$ ↔1T' $MoTe_2$) depending on the temperature of the substrate. This allows light modulation since optical properties are changed due to the phase transition.

The structure of the display device and a method for manufacturing the same are described more specifically referring to FIGS. 3A-3F.

FIGS. 3A-3F are cross-sectional views for illustrating the steps of a method for manufacturing a display device using a two-dimensional phase transition material according to an exemplary embodiment of the present disclosure.

Figure 3A:
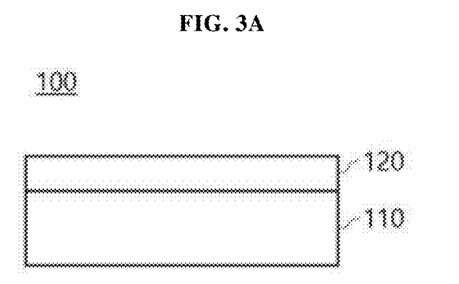
FIGS. 3A-3F are cross-sectional views for illustrating the steps of a method for manufacturing a display device using a two-dimensional phase transition material according to an exemplary embodiment of the present disclosure.

First, as shown in FIG. 3A, a metal layer 120 may be formed on a substrate 110. For example, the substrate 110 may be formed as a silicon substrate, and the metal layer 120 may be formed by depositing silver (Ag) to a thickness of 50 nm by electron-beam (e-beam) evaporation. The metal layer 120 may serve to reflect incident light wave to a back reflector.

Figure 3B:
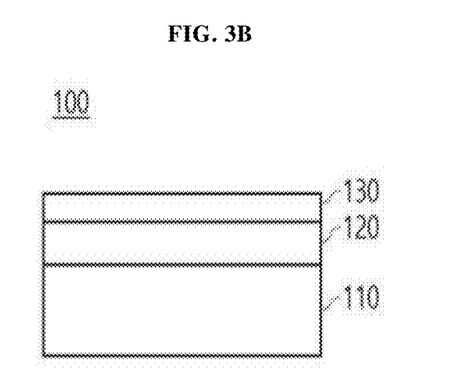

Then, as shown in FIG. 3B, an insulation layer 130 may be formed on the metal layer 120. For example, the insulation layer 130 may be formed by depositing silicon dioxide ($SiO_2$) to a thickness of 20 nm by plasma-enhanced chemical vapor deposition (PECVD). The insulation layer 130 may serve as a spacer and may amplify the absorption of incident light wave.

Figure 3C:
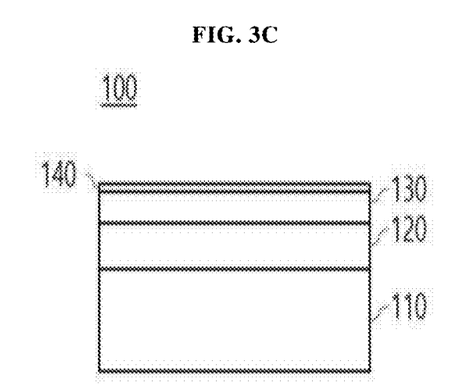

Then, as shown in FIG. 3C, a transparent electrode layer 140 may be formed on the insulation layer 130. For example, the transparent electrode layer 140 may be formed by wet transfer of single-layer graphene grown by chemical vapor deposition (CVD) to a thickness of 0.34 nm. Graphene is transparent in the visible region and may be used as a channel material of a phototransistor.

Figure 3D:
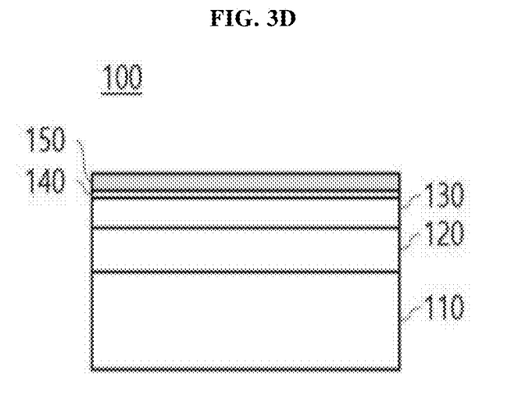

Then, as shown in FIG. 3D, a light absorption layer 150 may be formed on the transparent electrode layer 140. For example, the light absorption layer 150 may be formed by mechanical exfoliation of 2H phase molybdenum ditelluride ($MoTe_2$) in bulk and pick-up transfer to a thickness of 5 nm.

Figure 3E:
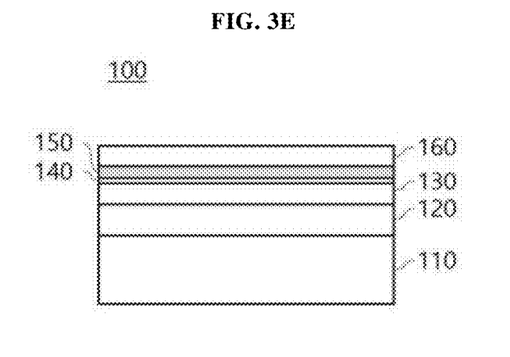

Then, as shown in FIG. 3E, a passivation layer 160 may be formed on the light absorption layer 150. For example, the passivation layer 160 may be formed by depositing aluminum oxide ($Al_2O_3$) to a thickness of 20 nm by atomic layer deposition (ALD). The passivation layer 160 may serve to prevent oxidation of the light absorption layer 150.

Figure 3F:
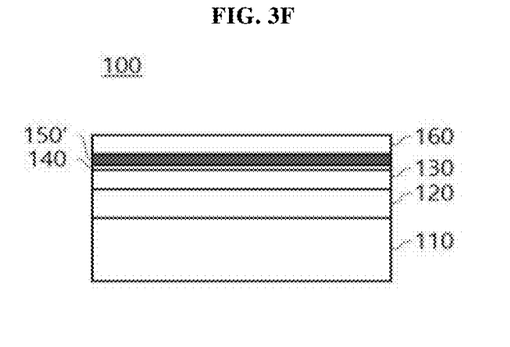

A display device 100 manufactured by the process described referring to FIGS. 3A-3E may have a structure optimized for increased absorbance of the light absorption layer 150. In addition, when heat is added to the display device 100, the light absorption layer 150' undergoes phase transition of molybdenum ditelluride ($MoTe_2$) to 1T' phase as shown in FIG. 3F. The phase transition is a reversible process.

Although the materials, thicknesses and formation methods of the layers constituting the display device were described in detail in the foregoing embodiments, it is apparent that the present disclosure is not necessarily limited thereto and various materials, thicknesses and formation methods known to those of ordinary skill can be applied.

Figure 4:
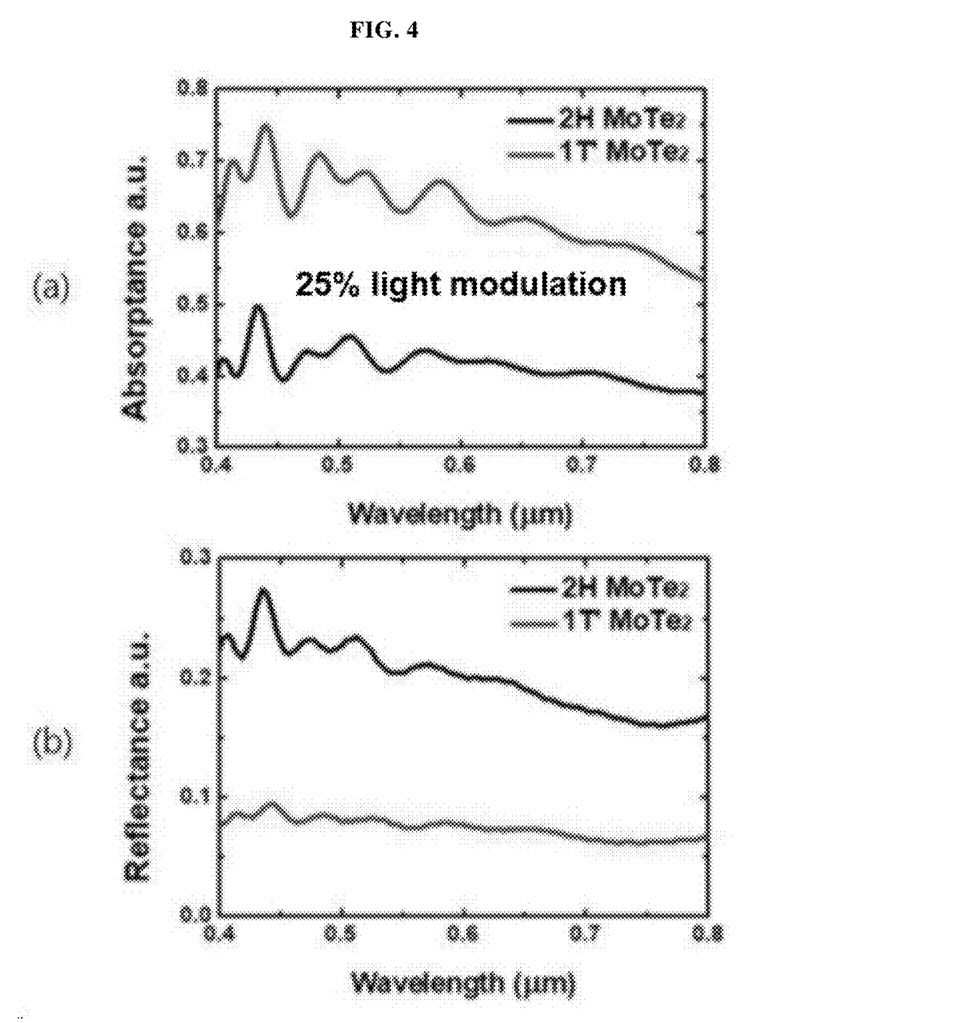
FIG. 4 shows the light absorbance and reflectance of a display device using a two-dimensional phase transition material according to an exemplary embodiment of the present disclosure depending on wavelength.

FIG. 4 shows the light absorbance and reflectance of a display device using a two-dimensional phase transition material according to an exemplary embodiment of the present disclosure depending on wavelength. FIG. 4 shows (a) absorbance depending on wavelength, and (b) reflectance depending on wavelength.

Referring to FIG. 4, it can be seen that the absorbance of the light absorption layer formed of molybdenum ditelluride ($MoTe_2$) is changed (by approximately 25%) due to phase transition. Through this, a black and white display device of complete absorption (i.e., black) and complete reflection (i.e., white) can be embodied.

Figure 5:
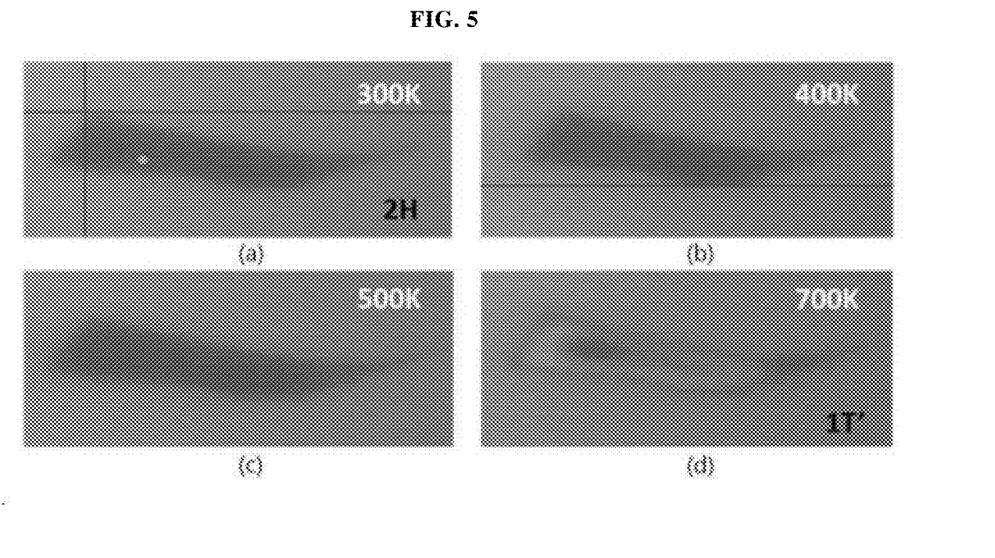
FIG. 5 shows exemplary phase transition of a display device using a two-dimensional phase transition material manufactured according to an exemplary embodiment of the present disclosure depending on temperature.

FIG. 5 shows exemplary phase transition of a display device using a two-dimensional phase transition material manufactured according to an exemplary embodiment of the present disclosure depending on temperature.

Referring to FIG. 5, it can be seen that the light absorption layer formed of molybdenum ditelluride ($MoTe_2$) undergoes phase transition from 2H phase to 1T' phase as the temperature of the substrate is changed from 300 K to 400 K, 500 K and 700 K, resulting in change in color.

Figure 6:
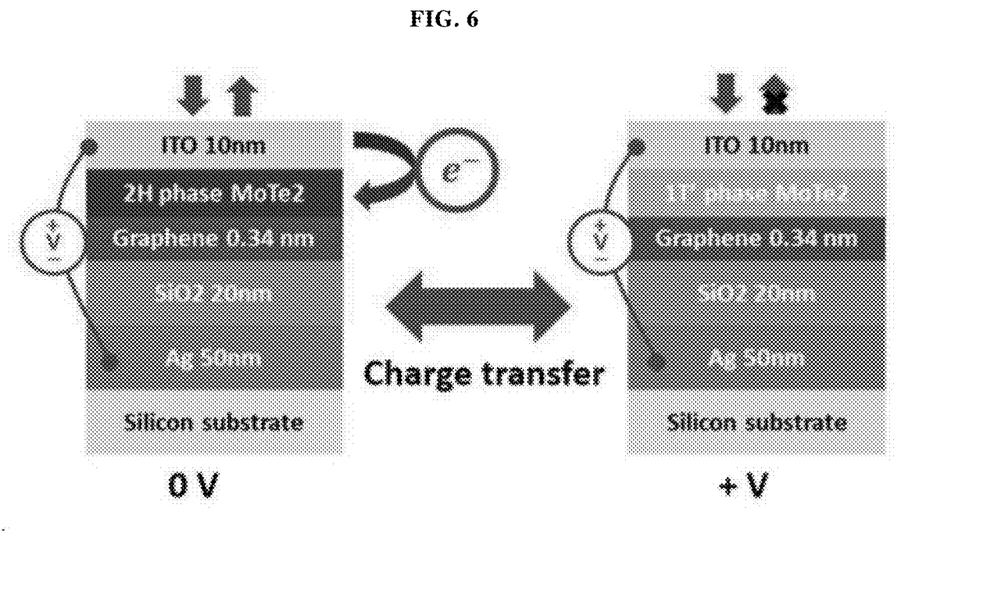
FIG. 6 schematically shows a display device using a two-dimensional phase transition material according to another exemplary embodiment of the present disclosure.

FIG. 6 schematically shows a display device using a two-dimensional phase transition material according to another exemplary embodiment of the present disclosure.

As shown in FIG. 6, a display device using a two-dimensional phase transition material according to another exemplary embodiment of the present disclosure may be configured by including metal layer (Ag) formed on a substrate (silicon substrate), an insulation layer ($SiO_2$) formed on the metal layer (Ag), a transparent electrode layer (graphene) formed on the insulation layer ($SiO_2$), a light absorption layer ($MoTe_2$) formed on the transparent electrode layer (graphene), and a passivation layer (ITO) formed on the light absorption layer ($MoTe_2$).

The light absorption layer may be formed of molybdenum ditelluride ($MoTe_2$), which is a two-dimensional phase transition material. The light absorption layer of the display device undergoes reversible phase change (i.e., 2H $MoTe_2$ ↔1T' $MoTe_2$) as a voltage is applied between the metal layer (Ag) and the passivation layer (ITO). This allows electrical light modulation since optical properties are changed due to the phase transition. More specifically, when a voltage is applied between the metal layer and the passivation layer, the charge of the passivation layer (ITO) is transported to the light absorption layer (MoTe$_2$), and the transported charge fills the vacant energy of the light absorption layer (MoTe$_2$) in the 2H phase, leading to transition to the 1T' phase.

The structure and manufacturing method of this display device are described in more detail referring to FIGS. 7A-7F.

FIGS. 7A-7F are cross-sectional views for illustrating the steps of a method for manufacturing a display device using a two-dimensional phase transition material according to another exemplary embodiment of the present disclosure.

Figure 7A:
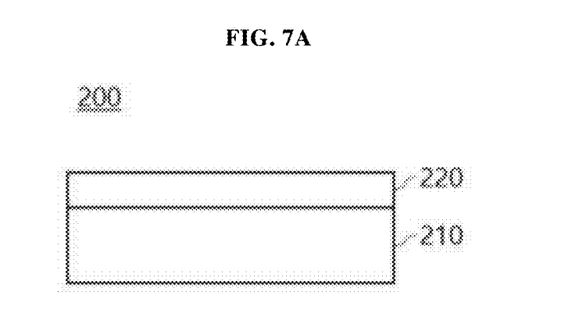
FIGS. 7A-7F are cross-sectional views for illustrating the steps of a method for manufacturing a display device using a two-dimensional phase transition material according to another exemplary embodiment of the present disclosure.

First, as shown in FIG. 7A, a metal layer 220 may be formed on a substrate 210. For example, the substrate 210 may be formed as a silicon substrate, and the metal layer 220 may be formed by depositing silver (Ag) to a thickness of 50 nm by electron-beam (e-beam) evaporation. The metal layer 220 may serve to reflect incident light wave to a back reflector and an electrode, and may serve to transport the charge of a passivation layer 260 to a light absorption layer 250.

Figure 7B:
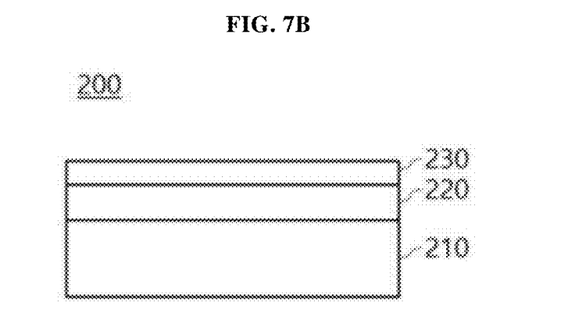

Then, as shown in FIG. 7b, an insulation layer 230 may be formed on the metal layer 220. For example, the insulation layer 230 may be formed by depositing silicon dioxide (SiO$_2$) to a thickness of 20 nm by plasma-enhanced chemical vapor deposition (PECVD). The insulation layer 230 may serve as a spacer and may amplify the absorption of incident light wave.

Figure 7C:
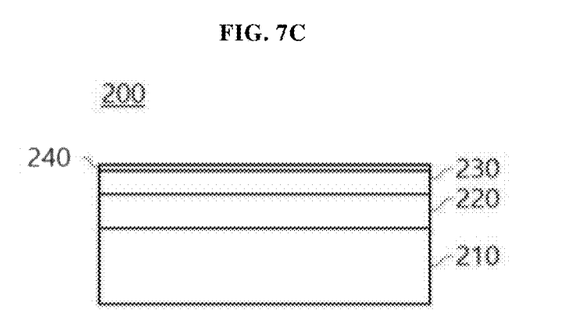

Then, as shown in FIG. 7C, a transparent electrode layer 240 may be formed on the insulation layer 230. For example, the transparent electrode layer 240 may be formed by wet transfer of single-layer graphene grown by chemical vapor deposition (CVD) to a thickness of 0.34 nm. Graphene is transparent in the visible region and may be used as a channel material of a phototransistor.

Figure 7D:
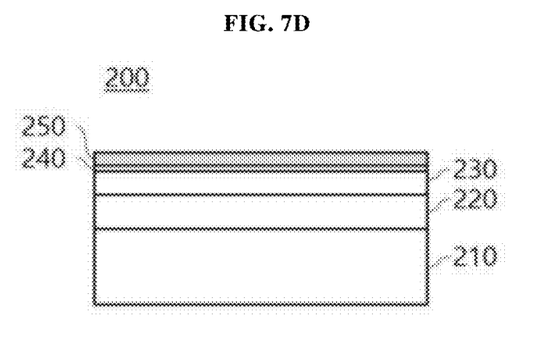

Then, as shown in FIG. 7D, a light absorption layer 250 may be formed on the transparent electrode layer 240. For example, the light absorption layer 250 may be formed by mechanical exfoliation of 2H phase molybdenum ditelluride (MoTe$_2$) in bulk and pick-up transfer to a thickness of 5 nm.

Figure 7E:
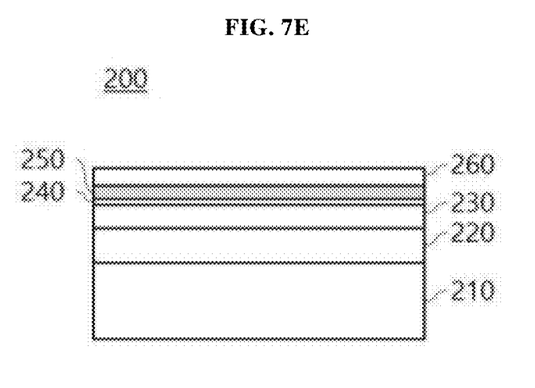

Then, as shown in FIG. 7E, a passivation layer 260 may be formed on the light absorption layer 250. For example, the passivation layer 260 may be formed by depositing indium tin oxide (ITO) to a thickness of 10 nm by using a sputtering system. The passivation layer 260 may serve to prevent oxidation of the light absorption layer 250 and may also serve as a transparent electrode in the visible region.

Figure 7F:
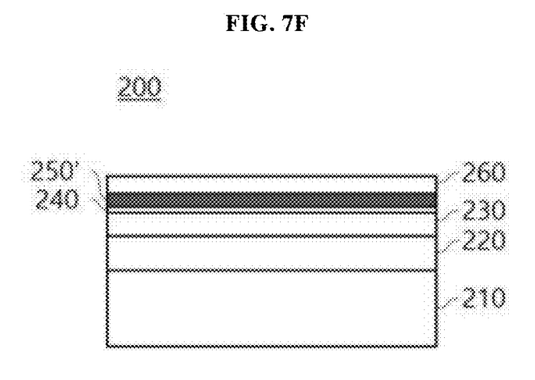

A display device 200 manufactured by the process described referring to FIGS. 7A-7E may have a structure optimized for increased absorbance of the light absorption layer 250. In addition, when a voltage is added between the metal layer 220 and the passivation layer 260 of the display device 200, the light absorption layer 250' undergoes phase transition of molybdenum ditelluride (MoTe$_2$) to 1T' phase as shown in FIG. 7F. The phase transition is a reversible process.

Although the materials, thicknesses and formation methods of the layers constituting the display device were described in detail in the foregoing embodiments, it is apparent that the present disclosure is not necessarily limited thereto and various materials, thicknesses and formation methods known to those of ordinary skill can be applied.

Figure 8:
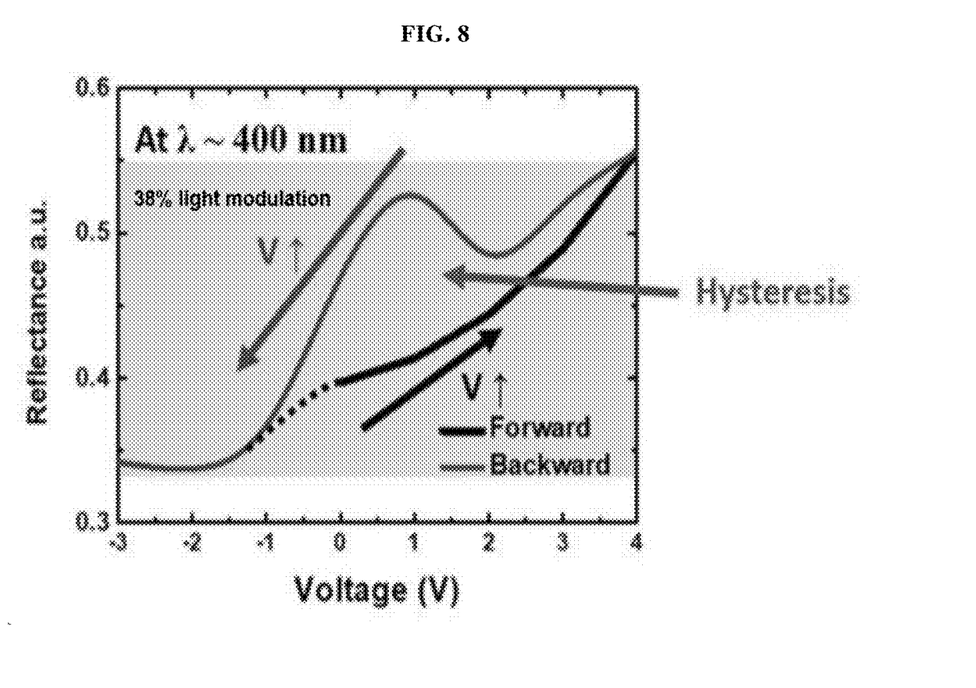
FIG. 8 shows the light reflectance of a display device using a two-dimensional phase transition material according to another exemplary embodiment of the present disclosure depending on voltage.

FIG. 8 shows the light reflectance of a display device using a two-dimensional phase transition material according to another exemplary embodiment of the present disclosure depending on voltage.

Referring to FIG. 8, it can be seen that phase transition is induced as a voltage is applied between the metal layer and the passivation layer of the display device and the reflectance is changed (by approximately 38%) as a result. That is to say, it can be seen that a black and white display device of complete absorption (i.e., black) and complete reflection (i.e., white), which can be operated electrically and is capable of reversible phase transition, can be embodied.

In addition, the operation voltage range of the display device is from −3V to 4V and light modulation is possible with low power.

In addition, it can be seen that a hysteresis curve is observed as the applied voltage is increased and decreased.

The present disclosure is not limited by the above-described exemplary embodiments and the attached drawings. It will be apparent to those of ordinary skill in the art to which the present disclosure belongs that substitutions, changes and modifications can be made to the constitutional elements of the present disclosure without departing from the technical idea of the present disclosure.

The invention claimed is:

1. A display device using a two-dimensional phase transition material, comprising:
    a substrate;
    a metal layer formed on the substrate;
    an insulation layer formed on the metal layer;
    a transparent electrode layer formed on the insulation layer;
    a light absorption layer formed on the transparent electrode layer and consisting of a phase transition material; and
    a passivation layer formed on the light absorption layer,
    wherein the light absorption layer undergoes reversible phase transition depending on any of temperature, magnetic field and electric field, and the light absorption layer is formed of molybdenum ditelluride.

2. The display device using a two-dimensional phase transition material of claim 1, wherein the passivation layer is formed of aluminum oxide and the light absorption layer undergoes phase transition from 2H to 1T' when heat is applied to the display device.

3. The display device using a two-dimensional phase transition material of claim 1, wherein the passivation layer is formed of indium tin oxide (ITO) and the light absorption layer undergoes phase transition from 2H to 1T' when a voltage is applied between the metal layer and the passivation layer as the passivation layer transfers charge to the light absorption layer.

4. A method for manufacturing a display device using a two-dimensional phase transition material, comprising:
    a step of forming a metal layer on a substrate;
    a step of forming an insulation layer on the metal layer;
    a step of forming a transparent electrode layer on the insulation layer;
    a step of forming a light absorption layer consisting of a phase transition material on the transparent electrode layer; and
    a step of forming a passivation layer on the light absorption layer,
    wherein the light absorption layer undergoes reversible phase transition depending on any of temperature, magnetic field and electric field, and the light absorption layer is formed of molybdenum ditelluride.

5. The method for manufacturing a display device using a two-dimensional phase transition material of claim 4, wherein, in the step of forming the metal layer, silver is deposited on a silicon substrate to a thickness of 50 nm by electron-beam evaporation.

6. The method for manufacturing a display device using a two-dimensional phase transition material of claim 4, wherein, in the step of forming the insulation layer, silicon dioxide is deposited on the metal layer to a thickness of 20 nm by plasma-enhanced chemical vapor deposition.

7. The method for manufacturing a display device using a two-dimensional phase transition material of claim 4, wherein, in the step of forming the transparent electrode layer, the transparent electrode layer is formed by wet transfer of single-layer graphene grown by chemical vapor deposition on the insulation layer to a thickness of 0.34 nm.

8. The method for manufacturing a display device using a two-dimensional phase transition material of claim 4, wherein, in the step of forming the light absorption layer, the light absorption layer is formed by mechanical exfoliation of 2H phase molybdenum ditelluride on the transparent electrode layer to a thickness of 5 nm.

9. The method for manufacturing a display device using a two-dimensional phase transition material of claim 4, wherein, in the step of forming the passivation layer, indium tin oxide is deposited on the light absorption layer to a thickness of 10 nm by using a sputtering system.

10. The method for manufacturing a display device using a two-dimensional phase transition material of claim 4, wherein, in the step of forming the passivation layer, aluminum oxide is deposited on the light absorption layer to a thickness of 20 nm by atomic layer deposition.

11. A display device using a two-dimensional phase transition material, comprising:
a substrate;
a metal layer formed on the substrate;
an insulation layer formed on the metal layer;
a transparent electrode layer formed on the insulation layer;
a light absorption layer formed on the transparent electrode layer and consisting of a phase transition material; and
a passivation layer formed on the light absorption layer,
wherein the light absorption layer is formed of molybdenum ditelluride.

12. The display device using a two-dimensional phase transition material of claim 11, wherein the passivation layer is formed of aluminum oxide and the light absorption layer undergoes phase transition from 2H to 1T' when heat is applied to the display device.

13. The display device using a two-dimensional phase transition material of claim 11, wherein the passivation layer is formed of indium tin oxide (ITO) and the light absorption layer undergoes phase transition from 2H to 1T' when a voltage is applied between the metal layer and the passivation layer as the passivation layer transfers charge to the light absorption layer.

* * * * *